(12) United States Patent
Enomoto

(10) Patent No.: US 7,411,514 B2
(45) Date of Patent: Aug. 12, 2008

(54) FAILURE DETECTING APPARATUS

(75) Inventor: Keiichi Enomoto, Kanagawa (JP)

(73) Assignee: Mitsuba Corporation, Kiryu-shi, Gunma-ken (JP)

( * ) Notice: Subject to any disclaimer, the term of this patent is extended or adjusted under 35 U.S.C. 154(b) by 218 days.

(21) Appl. No.: 11/260,235

(22) Filed: Oct. 28, 2005

(65) Prior Publication Data
US 2006/0132145 A1 Jun. 22, 2006

(30) Foreign Application Priority Data
Oct. 29, 2004 (JP) ............ P.2004-316094

(51) Int. Cl.
*G08B 21/00* (2006.01)
*G01R 27/00* (2006.01)

(52) U.S. Cl. ............ 340/635; 340/661; 324/76.11; 324/647

(58) Field of Classification Search ........... 340/635, 340/657, 660–663; 324/76.11, 647; 714/734, 714/819
See application file for complete search history.

(56) References Cited

U.S. PATENT DOCUMENTS
7,116,239 B2 * 10/2006 Muratov et al. ............ 340/635

FOREIGN PATENT DOCUMENTS
JP      2003-248022      9/2003

OTHER PUBLICATIONS
Chinese Office Action dated Jan. 11, 2008 with English translation.
* cited by examiner

*Primary Examiner*—George A Bugg
(74) *Attorney, Agent, or Firm*—McGinn IP Law Group PLLC

(57) ABSTRACT

The failure detecting apparatus includes an input circuit 13 connected to a temperature sensor 53 to detect various changes, for detecting the resistance of the temperature sensor 53, a monitor circuit 14 connected in parallel to the input circuit 13 for monitoring the failure of the input circuit 13, and a CPU 1 which is supplied with the resistance of the temperature sensor 53 detected by the input circuit 13 and in detecting failure of the monitor circuit 14, switches its state between the inputting state receiving a signal from the monitor circuit 14 and the outputting state sending the signal to the monitor circuit 14.

18 Claims, 2 Drawing Sheets

FAILURE DETECTING APPARATUS

This application claims priority based on Japanese Patent application no. 2004-316094, filed Oct. 29, 2004, the contents of which is incorporated herein by reference in its entirety. This priority claim is being made concurrently with the filing of the application.

BACKGROUND OF THE INVENTION

This invention relates to a wire-breakage detecting apparatus mounted in e.g. a motor vehicle, for detecting failure such as wire breakage in a circuit which is driven in order to detect a thermal resistance and thermal conductivity of liquid by a bridge circuit in determining whether or not a urea water for a urea SCR (Selective Catalyst Removing method) catalyst for decomposing NOx contained in an exhaust gas into water and nitrogen has an appropriate urea density.

Traditionally, as a urea density sensor for an exhaust gas cleaning system for e.g. a diesel vehicle, by amplifying a minute signal of 0.1 mV as a sensor signal, A/D converting it by a microcomputer and supplying a signal indicative of a urea density value to the exhaust gas cleaning system, the exhaust gas cleaning system is monitored if it operates appropriately. As a technology used for such a urea density sensor, a power source circuit is employed and the voltage is supplied from the power source circuit to a heater resistor.

Further, traditionally, as a failure detecting technique for failure detection between the above power source circuit and heater resistor, as described in Patent Reference 1 identified below, a technique such as a comparator abnormality detecting device, which can detect the abnormality due to failure of a peripheral device as well as the comparator, is known.

Patent Reference 1: JP-A-2003-248022

Meanwhile, in view of the trend of exhaust gas control in recent years, it is necessary to severely control the specific component contained in the exhaust gas. Therefore, it has been eagerly demanded to measure periodically the exact urea density by application of a voltage to the heater resistor. Thus, it has been demanded to provide an exact output voltage from the power source circuit to the sensor resistor and accurately detect failure of the circuit portion connected from the power source circuit to the sensor resistor.

SUMMARY OF THE INVENTION

This invention has been accomplished in view of the above circumstance. An object of this invention is to provide a failure detecting apparatus capable of surely and accurately detecting the failure of circuit elements constituting an input circuit from the sensor (detecting) resistor to a control member such as CPU.

The failure detecting apparatus according to this invention includes an input circuit connected to a detecting resistor to detect various changes, for detecting the resistance of the detecting resistor; a monitor circuit connected in parallel to the input circuit for monitoring the failure of the input circuit; and a control member which is supplied with the resistance of the detecting resistor detected by the input circuit and in detecting failure of the monitor circuit, switches its state between the inputting state receiving a signal from the monitor circuit and the outputting state sending the signal to the monitor circuit.

In the failure detecting apparatus, the above problem is solved in such a manner that in detecting the failure of the monitor circuit, the control member switches the monitor circuit from the inputting state to the outputting state and determines that the monitor circuit is out of order if a difference between the A/D converted value of the input circuit before the monitor circuit is switched from the inputting state to the outputting state and the A/D converted value of the input circuit after the monitor circuit after the monitor circuit has been switched from the inputting state to the outputting state is not within a predetermined range.

In the failure detecting apparatus according to this invention, in detecting the failure of the monitor circuit, the monitor circuit is switched from the inputting state to the outputting state and it can be determined that the monitor circuit is out of order if a difference between the A/D converted value of the input circuit before the monitor circuit is switched from the inputting state to the outputting state and the A/D converted value of the input circuit after the monitor circuit after the monitor circuit has been switched from the inputting state to the outputting state is not within a predetermined range. Thus, it is possible to surely and accurately detect failure in the circuit elements constituting an input circuit from a sensor (detecting) resistor to a control member such as CPU.

DETAILED DESCRIPTION OF THE PREFERRED EMBODIMENTS

Figure 1:
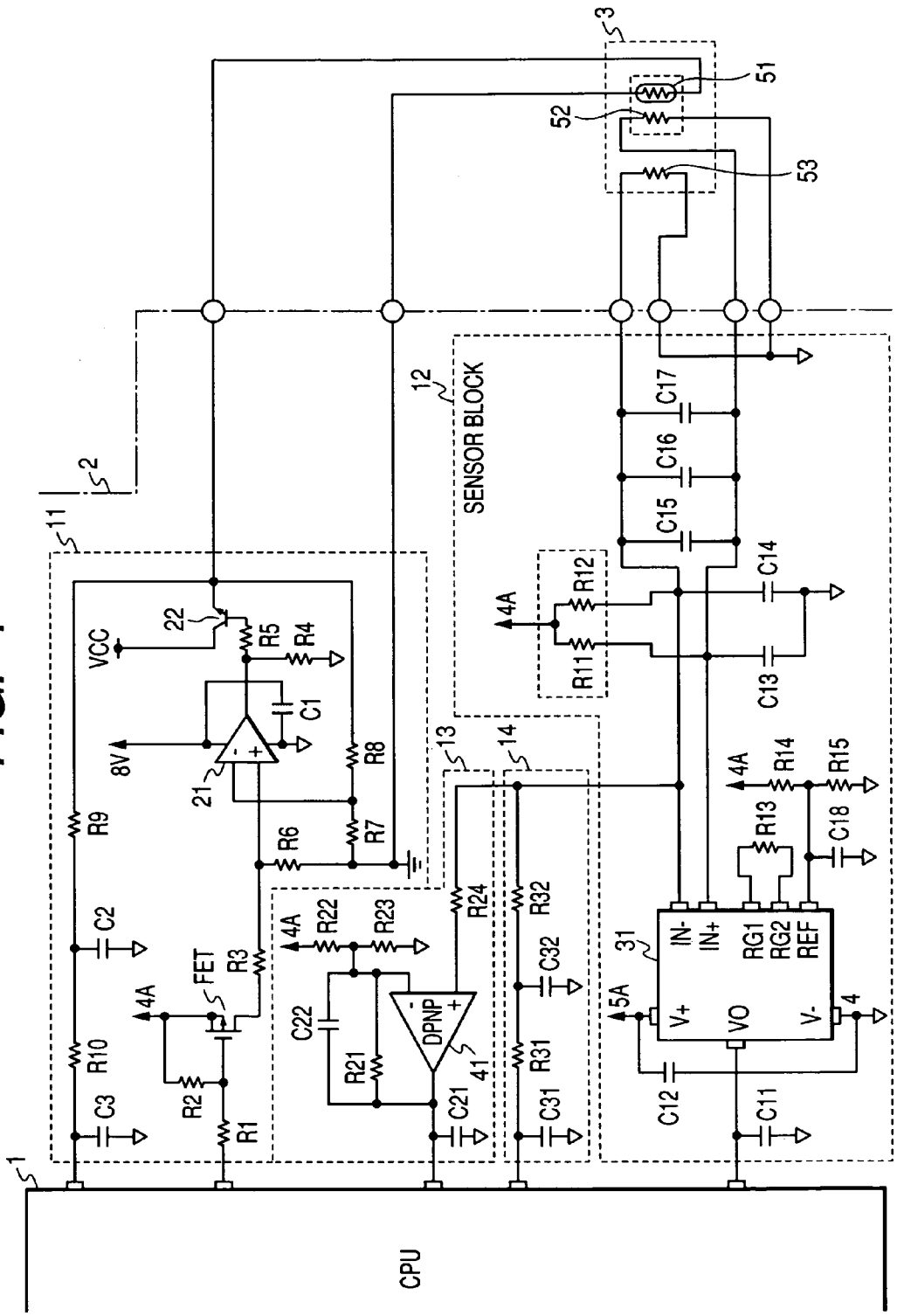
FIG. 1 is a circuit diagram showing the entire configuration of a urea water detecting system to which this invention is applied.

Now referring to the drawings, an explanation will be given of an embodiment of this invention.

This invention is applied to a urea water detecting system as constructed as shown in FIG. 1.

The urea water detecting system is mounted in a motor vehicle running by e.g. a diesel engine, and detects the urea density of a urea water for a urea SCR catalyst for decomposing NOx contained in the exhaust gas exhausted from a diesel engine vehicle into water and nitrogen and supplies the detected urea density to an exhaust gas cleaning system (not shown).

The urea water detecting system, as seen from FIG. 1, is mainly constructed in an arrangement in which a CPU 1 (control member) is connected to a heater driving circuit 11, a sensor block 12, an input circuit 13 and a monitor circuit 14, which are loaded on a circuit board 2, and a detecting circuit 3 is connected to the circuit board 2.

The CPU 1 is also connected to an ignition power source, which is actuated by the ignition switch for a motor vehicle, and a power source circuit (both not shown). The CPU 1 is supplied with a 5 V reference power source converted from ignition power source. The heater driving circuit 11 is connected to a voltage boosting circuit (not shown) which boosts the 5 V reference power source. The heater driving circuit 11 is supplied with a 8 V power source converted from the 5 V reference power source. Thus, under the control of the CPU 1, the heater driving circuit 11 converts the voltage supplied by the CPU 1 into a predetermined operating voltage to be supplied to the detecting circuit 3.

In this way, the detecting circuit 3 supplies the detected output indicative of the presence/absence of the urea containing water and whether or not the urea containing water has an appropriate urea density, to the CPU 1 through the sensor block 12. The CPU 1 performs the operation of converting the output value from the sensor block 12 into the urea density of the urea containing water and supplies the urea density to an exhaust gas cleaning system (not shown) through a communication circuit (not shown).

The detecting circuit 3 includes temperature sensors 52, 53, which are resistors constituting a bridge circuit together with resistors R11, R12 of the heater driving circuit 11, and a heater resistor 51 connected to the heater driving circuit 11. Incidentally, the resistors R11 and R12 have resistance of e.g. 3.9 kΩ.

The bridge circuit is constructed of the resistor R12, temperature sensor 52 of a resistor, resistor R11 and temperature sensor 53 which are bridge-connected. The one end of the bridge circuit is connected to a reference voltage IC and others whereas the other end thereof is connected to a GND terminal. The resistors R12 and R11 are formed of e.g. a carbon resistor, and the temperature sensors 52 and 53 are formed of e.g. a platinum resistor. The platinum resistor has a resistance change due to temperatures as large as about 3600 ppm/° C. The resistors R11 and R12 are arranged in the air whereas the temperature sensors 52 and 53 are arranged in the urea water.

The one resistor, e.g. temperature sensor 52 among the resistor R12, temperature sensor 52, resistor R11 and temperature sensor 53 is integrally assembled with the heater resistor 51. The heater resistor 51 is heated and the heat in the heater resistor 51 is conducted. When the heater resistor 51 is heated for a predetermined period at every predetermined periods, the resistance of the temperature sensor 52 periodically changes. The temperature sensors 52 and 53 in the sensor circuit are arranged within the urea water put in a urea water tank. The higher urea density the urea water has, the less dissipated heat in the urea water the heater resistor 51 generates and the less dissipated heat into the urea water the heater resistor 51 conducts to the temperature sensor 52. Thus, the resistance of the temperature sensor 52 abruptly increases. On the other hand, the lower urea density the urea water has, the more dissipated heat in the urea water the heater resistor 51 generates and the more dissipated heat into the urea water the heater resistor 52 generates. Thus, the electric resistance of the temperature sensor 52 slowly increases. Therefore, the changing rate of the voltage value at the connecting point of the resistor R12 and the temperature sensor 52 in the bridge circuit differs in proportion to the urea density of the urea water.

In the bridge circuit, the electric resistance of the temperature 52 increases owing to the heat supplied from the heater resistor 51 integrally assembled with the temperature sensor 52. When supply of the heat from the heater resistor 51 ceases, the temperature sensor 52 heated dissipates heat into the urea water so that its electric resistance decreases. And the voltage value divided by the resistor R12 and the temperature sensor 52 and the voltage value divided by the resistor R11 and the temperature sensor 53 are supplied to a sensor voltage output circuit 31 which is an operational amplifier. The sensor voltage output circuit 31 computes a differential voltage between the voltage value divided by the resistor R12 and the temperature sensor 52 and the voltage value divided by the resistor R11 and the temperature sensor 53, amplifies the differential voltage. The amplified differential voltage is supplied as an output signal to the CPU 1.

Thus, the temperature rise in the temperature sensor 52 corresponding to the urea density is detected, and the detected output corresponding to the presence/absence of the urea containing water and whether or not the urea containing water has an appropriate urea density is supplied to the CPU 1.

The heater driving circuit 11 serves as an emitter follower circuit in which the collector terminal of the transistor 22 is connected to the 5 V reference power source, the base terminal is connected to an operational amplifier 21 and the emitter terminal thereof is connected to the heater resistor 51.

The heater driving circuit 11 includes an FET with a gate terminal which is supplied with a pulse signal through resistors R1 and R2, the operational amplifier 21 and the transistor 22. The operational amplifier 21 compares the 5 V reference power source and the output voltage from the transistor 22 to control the voltage to be supplied to the transistor 22. The operational amplifier 21 is, at its output terminal, connected to the base terminal of the transistor 22 through a resistor R5 (100 Ω) and a resistor R4 (100 kΩ)

The operational amplifier 21 is also connected to the driving power source which produces 8 V voltage. The negative input terminal of the operational amplifier is connected to aground through resistors R7 and R8 (30 kΩ) and the positive input terminal thereof is connected to the drain terminal of the FET through a resistor R3 (50 kΩ) and a resistor R6 (30 kΩ).

On the side of the emitter terminal of the transistor 22, on the connecting line with the other terminal of the CPU 1, provided are a resistor R9 (47 kΩ), a capacitor C2 (0.01 μF), a resistor R10 (1 kΩ) and a capacitor C3 (100 pF).

Such a heater driving circuit 11 applies the voltage of 3.45 V to the heater resistor 51 from the heater driving circuit 11 for e.g. a predetermined period at every predetermined periods. At this time, the CPU 1 controls the voltage boosting circuit to convert the 5 V power source into the 8 V power source which is supplied to the operational amplifier 21. Simultaneously, the CPU 1 supplies a pulse output to the FET so that the power source of 3.45 V voltage-dropped by the operational amplifier 21 and transistor 22 is generated.

Thus, the temperature change in the urea containing water occurs. The temperature change is detected by the temperature sensors 52, 53 according to the level of the urea density and the presence/absence of liquid. The temperature change is converted into the urea density by the CPU 1.

The heater driving circuit 11 constructed as described above permits the transistor 22 to operate stably by connecting the 8 V power source converted from the 5 V reference power source by the voltage boosting circuit to the operational amplifier 21. Thus, in accordance with such a heater driving circuit 11, even if there are voltage drops due to the operational amplifier 21 and transistor 22, by using the 8 V power source in the voltage boosting circuit, a predetermined voltage of 3.4 V can be surely supplied to the heater resistor 51. Further, in this heater driving circuit 11, since the 5 V reference power source converted by a power source circuit 11 serves as a power source for the voltage boosting circuit, it is not necessary to take the loss due to serge protection and voltage drop into consideration.

The sensor block 12 connected to the detecting circuit 3 includes a sensor voltage output circuit 31 connected to the CPU 1. With respect to the sensor voltage output circuit 31, in parallel to a capacitor C15 (1000 pF), a capacitor C16 (1000 pF) and a capacitor C17 (0.1 μF), the temperature sensor 53 is connected to the negative terminal (IN−) thereof and the temperature sensor 52 is connected to the positive terminal (IN+) thereof. Thus, the sensor block 12 is connected to a bridge circuit consisting of a resistor R11, a resistor R12, temperature sensor 52 and temperature sensor 53.

Further, the sensor voltage output circuit 31 is an amplifier which is connected to a capacitor C13 (0.1 μF) and a capacitor C14 (0.1 μF) as well as the resistor R11 and resistor R12. A resistor R13 (4.02 kΩ) is connected to the RG1 terminal and RG2 terminal. A capacitor C18 (0.1 μF), resistor R14 (68 kΩ)

and resistor R15 (10 kΩ) for stabilization are connected to the REF terminal. Thus, the voltages detected by the temperature sensors 52, 53 are supplied to the IN- terminal and IN+ terminal, respectively. The amplification factor of the sensor voltage output circuit 31 is regulated by the resistor R13 connected to the RG1 terminal and RG2 terminal.

Such a sensor voltage output circuit 31 is supplied with a detected signal corresponding to a temperature change in the temperature sensor 52 according to the level of the urea density and presence/absence of liquid. Thus, the sensor voltage output circuit 31 detects a differential voltage between the voltage value inputted to the positive terminal IN+ and the voltage value inputted to the negative terminal IN-, and amplifies the differential voltage to be supplied to the CPU 1. The CPU 1 converts the differential voltage into a urea density signal.

On the connecting line between the negative terminal and temperature sensor 53, the sensor block 12 is connected to two input systems of an input circuit 13 and a monitor circuit 14. These input circuit 13 and monitor circuit 14 are connected in parallel to the connecting line between the sensor voltage output circuit 31 and temperature sensor 53.

The input circuit 13 includes an operational amplifier 41 connected to the CPU 1 through a capacitor C21; a resistor R21 (47 kΩ), a capacitor C22 (0.1 µF), a resistor R22 (27 kΩ) and resistor R23 (12 kΩ) connected to the negative terminal of the operational amplifier 41; and a resistor R24 (10 kΩ) connected between the positive terminal of the operational amplifier 41 and sensor block 12. The monitor circuit 14 includes a capacitor C31 (100 pF), a resistor R31 (1 kΩ), a capacitor C32 (0.01 µF) and a resistor R32 (47 kΩ) arranged from the side of the CPU 1 between the CPU 1 and the sensor block 12.

The monitor circuit 14 detects the failure of the input circuit 13 by detecting the failure due to wire breakage of the monitor circuit 14 itself. In this way, when the failure is detected, the monitor circuit 14 and input circuit 13 are controlled by the CPU 1 so that the failure detecting processing is carried out by the CPU 1.

Figure 2:
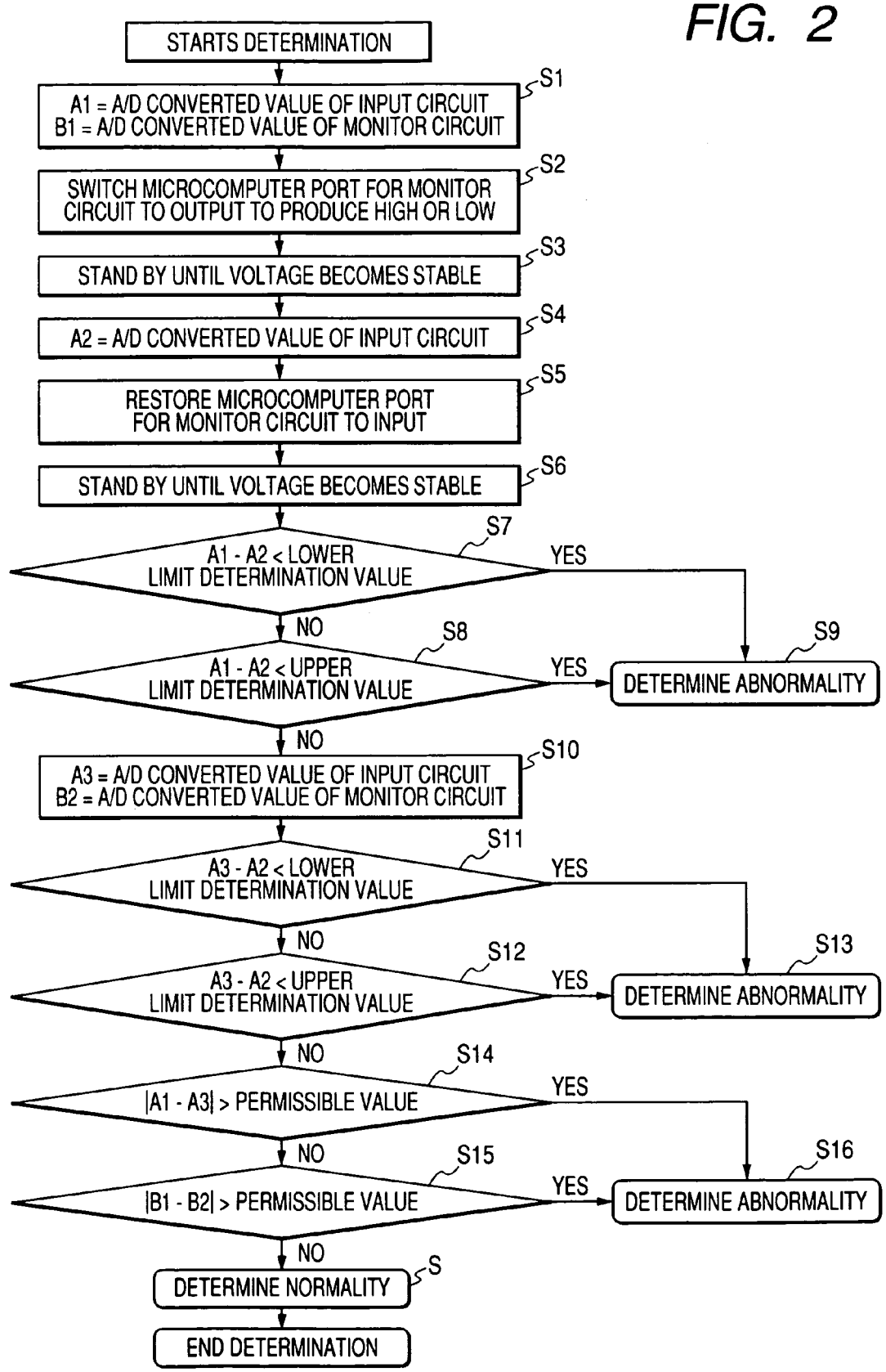
FIG. 2 is a flowchart showing the processing procedure of failure detecting processing by the urea water detecting system to which this invention is applied.

The failure detecting processing is carried out by the CPU 1 in the flowchart as shown in FIG. 2. Incidentally, as a premise of this failure detecting processing, it is assumed that both the stand-by time and determination time described later are sufficiently shorter than the time taken until an input change is completed.

When a failure detecting timing is reached, in step S1, the CPU 1 acquires an A/D converted value A1 of the input circuit 13, which is supplied to the input circuit 13 through the sensor block 12 and inputted to the CPU 1 through the operational amplifier 41, and acquires an A/D converted value Bi of the monitor circuit 14, which is supplied to the monitor circuit 14 through the sensor block 12 and inputted to the CPU 1. In this case, the CPU 1 acquires plural times the A/D converted value A1 of the input circuit 13 and the A/D converted value B1 of the monitor circuit 14 to acquire the average values of the A/D converted value A1 of the input circuit 13 and the A/D converted value B1 of the monitor circuit 14.

Next, in step S2, the CPU 1 switches the microcomputer port for the monitor circuit 14 to the output to produce an H (high) signal or an L (low) signal. Now, the CPU 1 selects which of the H signal and L signal should be inputted in order to enhance the abnormality (failure) detecting accuracy in later processing. In this case, the CPU 1 selects the change with a larger degree between the change in the voltage value when the output from the monitor circuit 14 has been switched from H to L and that when the output from the monitor circuit 14 has been switched from L to H within a voltage range in which an analog voltage value of the input circuit 13 after switching to be detected in step S4 can be A/D converted.

In step S3, the CPU 1 stands by until the voltage becomes stable at the H level or L level after the microcomputer port for the monitor circuit 14 in step S2 has been switched to the output.

In step S4, the CPU 1 acquires the A/D converted value A2 of the input circuit 13 when the voltage has become stable in step S3. Now the CPU 1 acquires the A/D converted value A2 of the input circuit 13 plural times to provide a plurality of A/D converted values A2 of the input circuit 13.

In step S5, the CPU 1 switches the microcomputer port for the monitor circuit 14 to the input. In step S6, the CPU 1 stands by until the voltage becomes stable after the microcomputer port for the monitor-circuit 14 has been switched to the input.

In step S7, the CPU 1 determines whether or not the value leaving when the A/D converted value A2 of the input circuit 13 after switching is subtracted from the A/D converted value A1 of the input circuit 13 before switching is smaller than a lower limit determination value. Further, in step S8, the CPU 1 determines whether or not the value leaving when the A/D converted value A2 of the input circuit 13 after switching is subtracted from the A/D converted value A1 of the input circuit 13 before switching is larger than an upper limit determination value. Now, the lower limit determination value is a value in the case where the A/D converted value drops from A1 to A2 when the output from the monitor circuit 14 has been switched from L level to H level, and is set at e.g. about 40 mV to 200 mV. The upper limit determination value is a value in the case where the A/D converted value drops from A1 to A2 when the output from the monitor circuit 14 has been switched from H level to L level, and is set at e.g. about −40 mV to 800 mV.

If it is determined in step S7 that the value leaving when the A/D converted value A2 of the input circuit 13 after switching is subtracted from the A/D converted value A1 of the input circuit 13 before switching is smaller than the lower limit determination value, or in step S8 that the value leaving when the A/D converted value A2 of the input circuit 13 after switching is subtracted from the A/D converted value A1 of the input circuit 13 before switching is larger than the upper limit determination value, in step S9, the CPU 1 determines that abnormality (failure) has occurred in the monitor circuit 14.

In this way, in step S2, where the monitor circuit 14 is switched from the inputting state to the outputting state to output the signal at the H level and the signal at the L level, the CPU 1 can detect that an unusually high voltage change or an unusually low voltage change has been generated. Thus, if the value leaving when the A/D converted value A2 of the input circuit 13 is subtracted from the A/D converted value A1 of the input circuit 13 does not satisfy the range of the upper limit determination value and lower limit determination value, the CPU 1 can detect that the failure such as wire breakage or short-circuiting has occurred in the monitor circuit 14, and hence, failure of the input circuit 13 has occurred.

On the other hand, if it is determined in step S7 that value leaving when the A/D converted value A2 of the input circuit 13 after switching is subtracted from the A/D converted value A1 of the input circuit 13 before switching is not smaller than the lower limit determination value, or in step S8 that the value leaving when the A/D converted value A2 of the input circuit 13 after switching is subtracted from the A/D converted value A1 of the input circuit 13 before switching is not larger than the upper limit determination value, the CPU 1 proceeds to the processing in step S10. The processing in step S10 et seq. is processing for enhancing the detecting accuracy in the failure detecting processing.

In step S10, the CPU 1 acquires the A/D converted value A3 of the input circuit 13 and the A/D converted value B2 of the monitor circuit 14 when in step S5, the monitor circuit 14 is switched from the outputting state to the inputting state. Now, the A/D converted value A3 of the input circuit 13 is previously stored in a memory (not shown) at the timing when step S6 has been completed. The CPU 1 acquires plural times the A/D converted value A3 of the input circuit 13 and the A/D converted value B2 to previously obtain the average values thereof.

In step S11, the CPU 1 determines whether or not the value leaving when the A/D converted value A2 of the input circuit 13 is subtracted from the A/D converted value A3 of the input circuit 13 is smaller than the lower limit determination value. Further, in step S12, the CPU 1 determines whether or not the value leaving when the A/D converted value A2 of the input circuit 13 is subtracted from the A/D converted value A3 of the input circuit 13 is larger than the upper limit determination value. Now, the upper limit determination value and lower limit determination value are set at the same values as those set in step S7 and step S8.

If it is determined that the value leaving when the A/D converted value A2 of the input circuit 13 is subtracted from the A/D converted value A3 of the input circuit 13 is smaller than the lower limit determination value, or the value leaving when the A/D converted value A2 of the input circuit 13 is subtracted from the A/D converted value A3 of the input circuit 13 is larger than the upper limit determination value, in step S13, the CPU 1 determines that abnormality (failure) has occurred in the monitor circuit 14, thereby completing the processing.

In this way, in step S5, by switching the monitor circuit 14 from the outputting state to the inputting state, the CPU 1 can detect that an unusually high voltage change or an unusually low voltage change has been generated. Thus, if the value leaving when the A/D converted value A2 of the input circuit 13 is subtracted from the A/D converted value A3 of the input circuit 13 does not satisfy the range of the upper limit determination value and lower limit determination value, the CPU 1 can detect that the failure such as wire breakage or short-circuiting has occurred in the monitor circuit 14, and hence, failure of the input circuit 13 has occurred.

On the other hand, if it is determined in step S11 that the value leaving when the A/D converted value A2 of the input circuit 13 is subtracted from the A/D converted value A3 of the input circuit 13 is not smaller than the lower limit determination value, or in step S12 that the value leaving when the A/D converted value A2 of the input circuit 13 is subtracted from the A/D converted value A3 of the input circuit 13 is not larger than the upper limit determination value, the CPU 1 proceeds to the processing in step S14.

In step S14, the CPU 1 determines whether or not the the absolute value leaving when the A/D converted value A3 of the input circuit 13 is subtracted from the A/D converted value A1 of the input circuit 13 is larger than a permissible value. Further, in step S15, the CPU 1 determines whether or the the absolute value leaving when the A/D converted value B2 of the monitor circuit 14 is subtracted from the A/D converted value B1 of the monitor circuit 14 is larger than the permissible value. In this way, the CPU 1 determines whether the A/D converted value of the input circuit 13 is within a permissible range and the A/D converted value of the monitor circuit 14 is within the permissible range before and after the monitor circuit 14 is restored from the outputting state to the inputting state. The range of the permissible value may be the same value. But where the error in the A/D conversion in the input circuit 13 and the error in the A/D conversion in the monitor circuit 14 are different, different permissible values may be employed for the input circuit 13 and monitor circuit 14.

If it is determined in step S14 that the absolute value leaving when the A/D converted value A3 of the input circuit 13 is subtracted from the A/D converted value A1 of the input circuit 13 is larger than the permissible value, the CPU 1 determines that abnormality (failure) has occurred in the input circuit 13 and proceeds to the processing in step S16. Further, if it is determined in step S15 that the absolute value leaving when the A/D converted value B2 of the monitor circuit 14 is subtracted from the A/D converted value B1 of the monitor circuit 14 is larger than the permissible value, the CPU 1 determines that abnormality (failure) has occurred in the monitor circuit 14 and proceeds to the processing in step S16.

Thus, if the A/D converted value is within a non-permissible range before and after the monitor circuit 14 is switched from the inputting state to the outputting state and thereafter the monitor circuit 14 is restored from the outputting state to the inputting state, it can be determined that failure has occurred in the input circuit 13 or the monitor circuit 14.

Incidentally, the embodiment described above are exemplary for this invention. Therefore, it is needless to say that this invention should not be limited to the embodiments described above, but can be realized in various modifications according to a design within a scope not departing from the technical concept of this invention.

What is claimed is:

1. A failure detecting apparatus comprising:
   an input circuit for detecting resistance of a detecting resistor, the detecting resistor detecting a plurality of changes;
   a monitor circuit connected in parallel to the input circuit for monitoring a failure of the input circuit; and
   a control member which is supplied with the resistance of the detecting resistor detected by the input circuit and which detects a failure in the monitor circuit, upon the detection of which the control member switches from an inputting state, where the control member receives a signal from the monitor circuit, to an outputting state, where the control member sends a signal to the monitor circuit,
   wherein, in detecting the failure of the monitor circuit, the control member switches the monitor circuit from the inputting state to the outputting state and determines that the monitor circuit is out of order if a difference between an A/D converted value of the input circuit before the monitor circuit is switched from the inputting state to the outputting state and an A/D converted value of the input circuit after the monitor circuit has been switched from the inputting state to the outputting state is not within a predetermined range.

2. The failure detecting apparatus according to claim 1, wherein the control member restores the monitor circuit from the outputting state to the inputting state after having switched the monitor circuit from the inputting state to the outputting state and determines that the monitor circuit is out of order if a difference between the A/D converted value of the input circuit after the monitor circuit has been switched from the inputting state to the outputting state and an A/D converted value of the input circuit after the monitor circuit has been restored from the outputting state to the inputting state is not within the predetermined range.

3. The failure detecting apparatus according to claim 2, wherein the control member determines that the monitor circuit is out of order if a difference between the A/D converted value of the input circuit before the monitor circuit is switched from the inputting state to the outputting state and the A/D converted value of the input circuit after the monitor circuit has been restored from the outputting state to the inputting state is not within a first permissible value, or if a difference between an A/D converted value of the monitor circuit before the monitor circuit is switched from the inputting state to the outputting state and an A/D converted value of the monitor circuit after the monitor circuit has been restored from the outputting state to the inputting state is not within a second permissible value.

4. The failure detecting apparatus according to claim 3, wherein the first permissible value equals the second permissible value.

5. The failure detecting apparatus according to claim 3, wherein an A/D conversion error value in the input circuit and an A/D conversion error value in the monitor circuit are different, and the first permissible value does not equal the second permissible value.

6. The failure detecting apparatus according to claim 1, wherein the detecting resistor is arranged in a liquid solution.

7. A method of detecting a failure of a circuit, comprising:
determining a first difference between A/D converted values of an input circuit before and after a first switching of a monitor circuit,
wherein a failure of the input circuit is determined when the first difference is one of lower than a lower limit determination value and higher than an upper limit determination value.

8. The method according to claim 7, wherein the first difference is between the lower limit determination value and the upper limit determination value.

9. The method according to claim 8, further comprising:
determining a second difference between an A/D converted value of the input circuit after a second switching of the monitor circuit and the A/D converted value of the input circuit after the first switching of the monitor circuit,
wherein the failure of the input circuit is determined when the second difference is one of lower than the lower limit determination value and higher than an upper limit determination value.

10. The method according to claim 9, wherein the second difference is between the lower limit determination value and the upper limit determination value.

11. The method according to claim 10, further comprising:
determining a third difference between the A/D converted value of the input circuit after the second switching of the monitor circuit and the A/D converted value of the input circuit before the first switching of the monitor circuit; and
determining a fourth difference between A/D converted values of the monitor circuit before the first switching and after the second switching of the monitor circuit,
wherein the failure of the input circuit is determined if the third difference is larger than a permissible value; and
wherein the failure of the monitor circuit is determined if the fourth difference is larger than a permissible value.

12. The method according to claim 7, wherein the A/D converted value of the input circuit before first switching of the monitor circuit is supplied by a sensor block outside of the input circuit and inputted to a CPU through an operational amplifier within the input circuit.

13. The method according to claim 11, wherein the A/D converted value of the monitor circuit before the first switching of the monitor circuit is supplied by a sensor block outside of the monitor circuit and inputted to a CPU.

14. The method according to claim 11, wherein the A/D converted values of the input circuit before and after the first switching of the monitor circuit and after the second switching of the monitor circuit and the A/D converted values of the monitor circuit before the first switching and after the second switching of the monitor circuit are acquired respectively plural times by a CPU and averaged respectively by the CPU such that average A/D converted values are respectively used to determine the first difference, the second difference, the third difference, and the fourth difference.

15. The method according to claim 11, wherein a CPU accomplishes the first and second switching of the monitor circuit.

16. The method according to claim 7, wherein the first switching of the monitor circuit is accomplished by a CPU switching a microcomputer port for the monitor circuit from input to output.

17. The method according to claim 9, wherein the second switching of the monitor circuit is accomplished by a CPU switching a microcomputer port for the monitor circuit from output to input.

18. The method according to claim 16, wherein the CPU accomplishes the first switching of the monitor circuit to produce one of a high signal and low signal.

* * * * *